United States Patent
Kim et al.

(10) Patent No.: US 8,451,970 B2
(45) Date of Patent: May 28, 2013

(54) VARIABLE DELAY CIRCUIT AND DELAY-LOCKED LOOP INCLUDING THE SAME

(75) Inventors: Chul Woo Kim, Seoul (KR); Young Ho Kwak, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 225 days.

(21) Appl. No.: 13/035,093

(22) Filed: Feb. 25, 2011

(65) Prior Publication Data

US 2011/0216864 A1 Sep. 8, 2011

(30) Foreign Application Priority Data

Mar. 8, 2010 (KR) .................. 10-2010-0020321

(51) Int. Cl.
- *H03D 3/24* (2006.01)
- *H04L 7/00* (2006.01)
- *H04L 25/40* (2006.01)
- *H03L 7/06* (2006.01)
- *H03L 7/00* (2006.01)

(52) U.S. Cl.
USPC ........... 375/374; 375/354; 375/371; 375/373; 327/158; 327/157; 327/156; 327/155; 327/141; 327/100

(58) Field of Classification Search
USPC .................. 375/374, 354, 371, 373; 327/158, 327/157, 156, 155, 141, 100
See application file for complete search history.

(56) References Cited

U.S. PATENT DOCUMENTS

| | | |
|---|---|---|
| 2006/0145740 A1* | 7/2006 | Park et al. ..................... 327/158 |
| 2006/0279342 A1* | 12/2006 | Blodgett ........................ 327/158 |
| 2009/0189658 A1* | 7/2009 | Tomar et al. .................. 327/158 |
| 2010/0253403 A1* | 10/2010 | Kantor et al. ................. 327/157 |

* cited by examiner

*Primary Examiner* — Chieh M Fan
*Assistant Examiner* — Michelle M Koeth
(74) *Attorney, Agent, or Firm* — Pearne & Gordon LLP (57) ABSTRACT

The present disclosure provides a variable delay circuit comprising a delay circuit that includes a first delay unit and a second delay unit and delays an input signal to generate an output signal; a selection signal generation unit that detects a delay value of the delay circuit and generates a selection signal to select a delay unit for delaying the input signal from the first delay unit and the second delay unit; a first control unit that controls a delay value of the delay unit selected by the selection signal in response to a delay increase/decrease signal; and a second control unit that controls a delay value of the delay unit which is not selected by the selection signal.

12 Claims, 8 Drawing Sheets

VARIABLE DELAY CIRCUIT AND DELAY-LOCKED LOOP INCLUDING THE SAME

FIELD OF THE INVENTION

The present disclosure relates to a variable delay circuit. To be more specifically, the present disclosure relates to a technique of designing a variable delay circuit capable of delaying a phase of an input signal by increasing a delay value in response to a delay increase signal and decreasing a delay value in response to a delay decrease signal.

BACKGROUND OF THE INVENTION

Most systems currently used are operated by being synchronized with a clock. Therefore, a quality of the clock is very important in these systems.

A clock and data recovery (CDR) circuit is a key circuit configured to correctly recover a clock required by a system in the data communication field and transmitted data from a data stream. In order to read data at an optimum position, a phase of the clock needs to be shifted to an optimum position for reading data, which can be accomplished by making the phase of the clock agree with a phase of data. Therefore, a circuit capable of freely controlling a phase of a clock is needed. As examples of a circuit for controlling a phase of a clock, a phase-locked loop (PLL) and a delay-locked loop (DLL) may be used.

Figure 1:
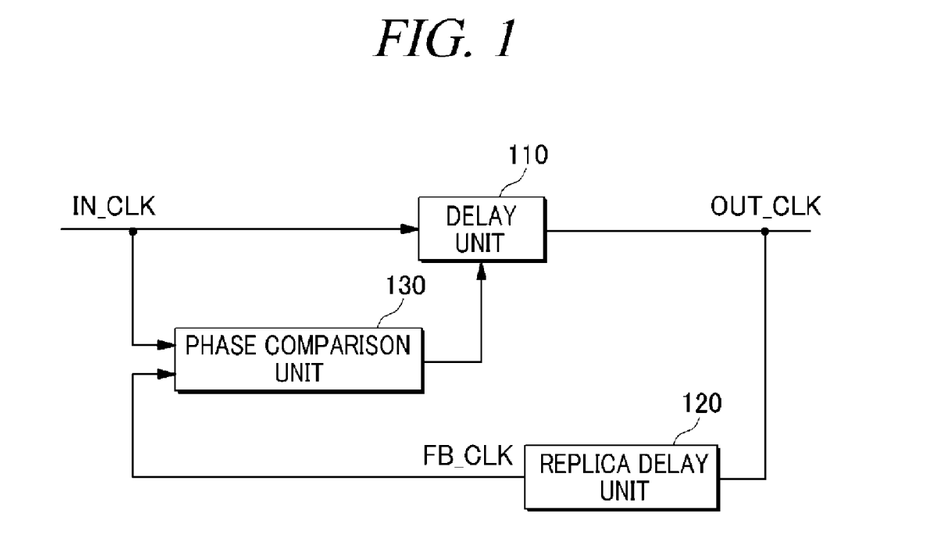
FIG. 1 is a configuration view showing a general configuration of a delay-locked loop.

FIG. 1 is a configuration view showing a general configuration of a delay-locked loop.

A delay-locked loop includes a delay unit 110 that delays an input clock (IN_CLK) to generate an output clock (OUT_CLK), a replica delay unit 120 that outputs a feedback clock (FB_CLK) by delaying the output clock (OUT_CLK) as much as a delay value within a system to which the delay-locked loop is applied, and a phase comparison unit 130 that compares the input clock (IN_CLK) with the feedback clock (FB_CLK) and increase or decrease the delay value of the delay unit to make the input clock (IN_CLK) equal to the feedback clock (FB_CLK).

The delay unit 110 increases or decreases its own delay value under the control of the phase comparison unit 130. However, the delay value of the delay unit 110 is limited and cannot be infinitely increased or decreased infinitely. Therefore, an operation range of the delay-locked loop is limited by the limit of the delay value of the delay unit 110.

Not only the delay-locked loop but other circuits that need to increase or decrease a delay value during an operation also have such a problem.

The present disclosure is suggested to solve a conventional problem described above and provides a variable delay circuit capable of infinitely increasing or decreasing a delay value and a delay-locked loop circuit including the variable delay circuit.

BRIEF SUMMARY OF THE INVENTION

In view of the foregoing, the present disclosure provides a variable delay circuit comprising a delay circuit that includes a first delay unit and a second delay unit and delays an input signal to generate an output signal; a selection signal generation unit that detects a delay value of the delay circuit and generates a selection signal to select a delay unit for delaying the input signal from the first delay unit and the second delay unit; a first control unit that controls a delay value of the delay unit selected by the selection signal in response to a delay increase/decrease signal; and a second control unit that controls a delay value of the delay unit which is not selected by the selection signal.

The input signal is a clock, and the second control unit controls the delay value of the non-selected delay unit to be N*clock (N is an integer of 2 or larger)–the delay value of the selected delay unit.

The selection signal generation unit generates a selection signal to change a delay unit selected at a time when a difference between the delay values of the first delay unit and the second delay unit becomes M*clock (M is an integer of 1 or larger).

The present disclosure provides a delay-locked loop including a variable delay unit that delays an external clock to output an internal clock, a replica delay unit that delays the internal clock to generate a feedback clock, and a phase comparison unit that compares a phase of the feedback clock with a phase of the external clock to generate a delay increase/decrease signal, and the variable delay unit is the variable delay circuit in accordance with the present disclosure.

The present disclosure provides a delay-locked loop comprising a variable delay unit that delays an external clock to output an internal clock; a replica delay unit that delays the internal clock to generate a feedback clock; and a phase comparison unit that compares a phase of the feedback clock with a phase of the external clock to generate a delay increase/decrease signal, wherein the variable delay unit includes a delay circuit that includes a first delay unit and a second delay unit and delays the external signal to generate the internal signal; a selection signal generation unit that detects a delay value of the delay circuit and generates a selection signal to select a delay unit for delaying the external signal from the first delay unit and the second delay unit; a first control unit that controls a delay value of the delay unit selected by the selection signal in response to a delay increase/decrease signal; and a second control unit that controls a delay value of the delay unit which is not selected by the selection signal.

In accordance with the present disclosure, by alternately using two voltage controlled delay lines, an input signal can be infinitely delayed. When a voltage controlled delay line cannot increase or decrease a delay value any more, the input signal can be infinitely delayed by using the other voltage controlled delay line.

Further, the present disclosure has an advantage of infinitely varying a phase of the input signal without greatly increasing a circuit area of the variable delay circuit.

DETAILED DESCRIPTION OF THE INVENTION

Hereinafter, embodiments of the present disclosure will be described in detail with reference to the accompanying drawings so that the present disclosure may be readily implemented by those skilled in the art. However, it is to be noted that the present disclosure is not limited to the embodiments but can be realized in various other ways.

Figure 2:
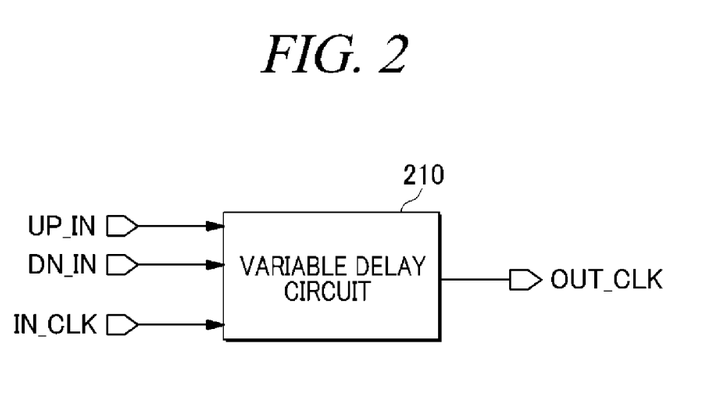
FIG. 2 is a block diagram showing an input signal and an output signal of the present disclosure.

FIG. 2 is a block diagram showing an input signal and an output signal of the present disclosure.

A variable delay circuit 210 increases or decreases its own delay value of an input signal (IN_CLK) in response to a delay increase/decrease signal (UP_IN/DN_IN). The delay increase/decrease signal (UP_IN/DN_IN) controls the delay value of the variable delay circuit 210. The delay increase/decrease signal (UP_IN/DN_IN) may be made up of a single signal or two or more signals.

If the delay increase/decrease signal (UP_IN/DN_IN) is made up of a single signal, a logical value of the delay increase/decrease signal (UP_IN/DN_IN) indicates information of an increase or decrease in a delay value. By way of example, if the delay increase/decrease signal (UP_IN/DN_IN) is "high", that means the delay value of the variable delay circuit 210 needs to be increased, and if the delay increase/decrease signal (UP_IN/DN_IN) is "low", that means the delay value of the variable delay circuit 210 needs to be decreased.

If the delay increase/decrease signal (UP_IN/DN_IN) is made up of two signals, i.e., a delay increase signal (UP_IN) and a delay decrease signal (DN_IN) and if the delay increase signal (UP_IN) is activated, that means the delay value of the variable delay circuit 210 needs to be increased, and if the delay decrease signal (DN_IN) is activated, the delay value of the variable delay circuit 210 needs to be decreased.

The block diagram of FIG. 2 shows the variable delay circuit 210 to which the delay increase signal (UP_IN) and the delay decrease signal (DN_IN) are inputted separately.

Figure 3:
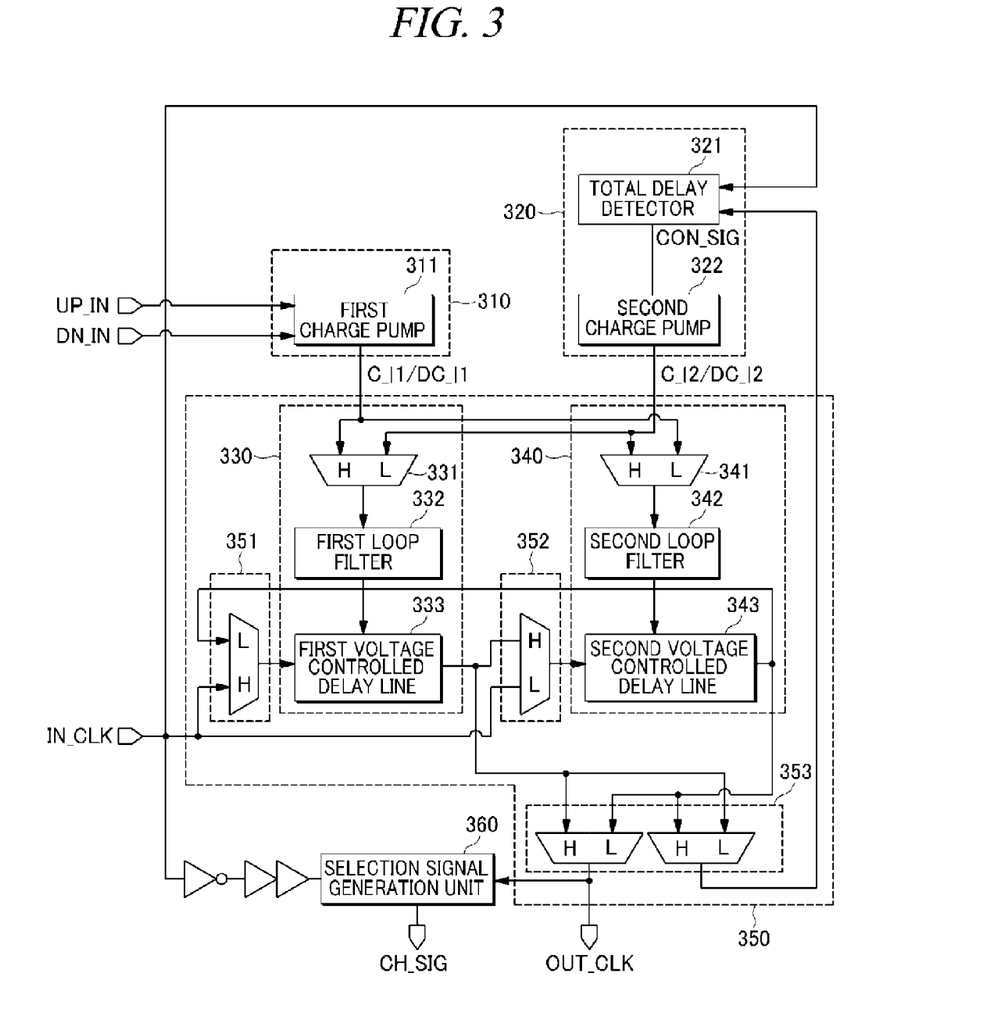
FIG. 3 is a configuration view of a variable delay circuit in accordance with an embodiment of the present disclosure.

FIG. 3 is a configuration view of a variable delay circuit in accordance with an embodiment of the present disclosure.

As depicted in FIG. 3, the variable delay circuit 210 in accordance with the present disclosure includes a first delay unit 330, a second delay unit 340, a delay circuit 350 that delays the input signal (IN_CLK) to generate an output signal (OUT_CLK), a selection signal generation unit 360 that detects a delay value of the delay circuit 350 and generates a selection signal (CH_SIG) which selects a delay unit to delay the input signal (IN_CLK) from the first delay unit 330 and the second delay unit 340, a first control unit 310 that controls a delay value of the delay unit selected by the selection signal (CH_SIG) in response to the delay increase/decrease signal (UP_IN/DN_IN), and a second control unit 320 that controls a delay value of the delay unit which is not selected by the selection signal (CH_SIG). In FIG. 3, the input signal (IN_CLK) and the output signal (OUT_CLK) are clock signals.

Hereinafter, the delay unit that is selected by the selection signal (CH_SIG) generated by the selection signal generation unit 360 and delays the input signal (IN_CLK) to generate the output signal (OUT_CLK) will be referred to as "selected delay unit" and the delay unit that is not selected by the selection signal (CH_SIG) generated by the selection signal generation unit 360 and delays the input signal (IN_CLK) to generate the output signal (OUT_CLK) in response to the output of "the selected delay unit" will be referred to as "non-selected delay unit." One of the first delay unit 330 and the second delay unit 340 is "the selected delay unit" and the other is "the non-selected delay unit."

The delay circuit 350 delays the input signal (IN_CLK) and generates the output signal (OUT_CLK). The delay circuit 350 includes the first delay unit 330 and the second delay unit 340, and "the selected delay unit" of them delays the input signal (IN_CLK) to generate the output signal (OUT_CLK). If the delay value of "the selected delay unit" cannot be increased or decrease any more, "the non-selected delay unit" "the selected delay unit" are changed to each other. By way of example, if the first delay unit 330 is "the selected delay unit" and the second delay unit 340 is "the non-selected delay unit," when a delay value of the first delay unit 330 cannot be increased or decrease any more, the second delay unit 340 is changed to "the selected delay unit" and the first delay unit 330 is changed to "the non-selected delay unit."

When the first delay unit 330 is "the selected delay unit," the first delay unit 330 controls its own delay value in response to a first charging/discharging current (C_I1/DC_I1), and when the first delay unit 330 is "the non-selected delay unit," the first delay unit 330 delays an output signal (OUT_CLK) of the second delay unit 340 in response to a second charging/discharging current (C_I2/DC_I2). The first delay unit 330 becomes "the selected delay unit" when the selection signal (CH_SIG) is "high" and becomes "the non-selected delay unit" when the selection signal (CH_SIG) is "low." The first delay unit 330 may include a first selection unit 331, a first loop filter 332, and a first voltage controlled delay line 333. The first selection unit 331 makes the first charging/discharging current (C_I1/DC_I1) pass through the first loop filter 332 when selection signal (CH_SIG) is "high" and makes the second charging/discharging current (C_I2/DC_I2) pass through the first loop filter 332 when the selection signal (CH_SIG) is "low." The first loop filter 332 is charged/discharged in response to a charging/discharging current selected by the first selection unit 331. The first voltage controlled delay line 333 increases a delay value when a voltage charged in the first loop filter 332 is low and decreases the delay value when the voltage charged in the first loop filter 332 is high.

When the second delay unit 340 is "the selected delay unit," the second delay unit 340 controls its own delay value in response to the first charging/discharging current (C_I1/DC_I1), and when the second delay unit 340 is "the non-selected delay unit," the second delay unit 340 delays an output signal (OUT_CLK) of the first delay unit 330 in response to the second charging/discharging current (C_I2/DC_I2). The second delay unit 340 becomes "the selected delay unit" when the selection signal (CH_SIG) is "low" and becomes "the non-selected delay unit" when the selection signal (CH_SIG) is "high." The second delay unit 340 may include a second selection unit 341, a second loop filter 342, and a second voltage controlled delay line 343. The second selection unit 341 makes the first charging/discharging current (C_I1/DC_I1) pass through the second loop filter 342 when selection signal (CH_SIG) is "low" and makes the second charging/discharging current (C_I2/DC_I2) pass through the second loop filter 342 when the selection signal (CH_SIG) is "high." The second loop filter 342 is charged/discharged in response to a charging/discharging current selected by the second selection unit 341. The second voltage controlled delay line 343 increases a delay value when a voltage charged in the second loop filter 342 is low and decreases the delay value when the voltage charged in the second loop filter 342 is high.

The delay circuit 350 may include a third selection unit 351 that inputs one of the input signal (IN_CLK) and the output signal of the second delay unit 340 to the first delay unit 330 in response to the selection signal (CH_SIG), a fourth selection unit 352 that inputs one of the output signal of the first delay unit 330 and the input signal (IN_CLK) to the second delay unit 340 in response to the selection signal (CH_SIG), and a fifth selection unit 353 that selects the output of "the selected delay unit" as the output signal (OUT_CLK) of the variable delay circuit 210 and transmits a signal obtained from the input signal (IN_CLK) passing through the first delay unit 330 and the second delay unit 340 to the second control unit 320. The third selection unit 351 inputs the input signal (IN_CLK) to the first delay unit 330 when the selection signal (CH_SIG) is "high" and inputs the output signal (OUT_CLK) of the second delay unit 340 to the first delay unit 330 when the selection signal (CH_SIG) is "low." The fourth selection unit 352 inputs the output signal (OUT_CLK) of the first delay unit 330 to the second delay unit 340 when the selection signal (CH_SIG) is "high" and transmits the input signal (IN_CLK) to the second delay unit 340 when the selection signal (CH_SIG) is "low." The fifth selection unit 353 selects the output signal of the first delay unit 330 as the output signal (OUT_CLK) of the variable delay circuit 210 and transmits the output signal of the second delay unit 340 to the second control unit 320 when the selection signal (CH_SIG) is "high" and selects the output signal of the second delay unit 340 as the output signal (OUT_CLK) of the variable delay circuit 210 and transmits the output signal of the first delay unit 330 to the second control unit 320 when the selection signal (CH_SIG) is "low."

There will be explained an operation of the delay circuit 350 when the selection signal (CH_SIG) is "high" and when the selection signal (CH_SIG) is "low."

When the selection signal (CH_SIG) is "high," the first delay unit 330 generates the output signal (OUT_CLK) by delaying the input signal (IN_CLK) passing through the third selection unit 351 by the first voltage controlled delay line 333. In this case, the delay value of the second delay unit 340 is controlled by the first charging/discharging current (C_I1/DC_I1) passing through the first selection unit 331.

The second voltage controlled delay line 343 delays the first delay unit 330's output signal passing through the fourth selection unit 352 and the second delay unit 340 transmits the output signal to the second control unit 320 via the fifth selection unit 353. In this case, the delay value is controlled by the second charging/discharging current (C_I2/DC_I2) passing through the second selection unit 341.

When the selection signal (CH_SIG) is "low," the second delay unit 340 generates the output signal (OUT_CLK) by delaying the input signal (IN_CLK) passing through the fourth selection unit 352 by the second voltage controlled delay line 343. In this case, the delay value is controlled by the first charging/discharging current (C_I1/DC_I1) passing through the second selection unit 341. The first voltage controlled delay line 333 delays the second delay unit 340's output signal passing through the third selection unit 351 and the first delay unit 330 transmits the output signal to the second control unit 320 via the fifth selection unit 353. In this case, the delay value of the first delay unit 330 is controlled by the second charging/discharging current (C_I2/DC_I2) passing through the first selection unit 331.

The first control unit 310 controls the delay value of "the selected delay unit" to be increased or decreased in response to the delay increase/decrease signal (UP_IN/DN_IN). The first control unit 310 may include a first charge pump 311 that generates the first charging/discharging current (C_I1/DC_I1). The first charge pump 311 generates the first discharging current (DC_I1) in response to the delay increase signal (UP_IN) and generates the first charging current (C_I1) in response to the delay decrease signal (DN_IN).

The second control unit 320 controls the delay value of "the non-selected delay unit" to be increased or decreased such that the delay value of "the non-selected delay unit" becomes 2*clock−the delay value of "the selected unit." The second control unit 320 may include a total delay detector 321 that receives the input signal (IN_CLK) and the signal obtained from the input signal (IN_CLK) passing through the first delay unit 330 and the second delay unit 340 and generates a control signal (CON_SIG) for controlling the delay value of "the non-selected delay unit" and a second charge pump 322 that generates the second charging/discharging current (C_I2/DC_I2) in response to the control signal (CON_SIG). The total delay detector 321 generates the control signal (CON_SIG) that increases or decreases the delay value of "the non-selected delay unit." The total delay detector 321 makes the delay value of the second delay unit 340 become 2*clock−the delay value of the first delay unit 330 when the selection signal (CH_SIG) is "high" (i.e., when the first delay unit 330 is "the selected delay unit"). That is, if the delay value of the first delay unit 330 is increased, a control signal (CON_SIG) for decreasing the delay value of the second delay unit 340 is generated and if the delay value of the first delay unit 330 is decreased, a control signal (CON_SIG) for increasing the delay value of the second delay unit 340 is generated. The total delay detector 321 makes the delay value of the first delay unit 330 become 2*clock−the delay value of the second delay unit 340 when the selection signal (CH_SIG) is "low" (i.e., when the second delay unit 340 is "the selected delay unit").

That is, if the delay value of the second delay unit 340 is increased, the delay value of the first delay unit 330 is controlled to be decreased, and if the delay value of the second delay unit 340 is decreased, the delay value of the first delay unit 330 is controlled to be increased. The second charge pump 321 generates the second discharging current (DC_I2) when the delay value is increased and generates the second charging current (C-I2) when the delay value is decreased.

The selection signal generation unit 360 changes a logic value of the selection signal (CH_SIG) for selecting "the selected delay unit" when a difference between the delay values of the first delay unit 330 and the second delay unit 340 is 1*clock. By way of example, in the initial state, if the first delay unit 330 is "the selected delay unit" and the delay increase signal (UP_IN) is inputted, the delay value of the first delay unit 330 is increased and the delay value of the second delay unit 340 is decreased, and when the delay value of the first delay unit 330 becomes 1.5*clock and the delay value of the second delay unit 340 becomes 0.5*clock, the second delay unit 340 is changed to "the selected delay unit." In the initial state, if the first delay unit 330 is "the selected delay unit" and the delay decrease signal (DN_IN) is inputted, the delay value of the first delay unit 330 is decreased and the delay value of the second delay unit 340 is increased, and when the delay value of the first delay unit 330 becomes 0.5*clock and the delay value of the second delay unit 340 becomes 1.5*clock, the second delay unit 340 is changed to "the selected delay unit." If the second delay unit 340 is "the selected delay unit" in the initial state, "the selected delay unit" and "the non-selected delay unit" are changed to each other in the same manner as described above. When a difference between the delay values of the first delay unit 330 and the second delay unit 340 becomes M*clock, the selective delay unit" and "the non-selected delay unit" can be changed to each other. That is because if the delay value is 0.5*clock, 1.5*clock, 2.5*clock or 0.5*clock+M*clock, a phase difference between the input signal (IN_CLK) and the output signal (OUT_CLK) becomes 0.5*clock, and, thus, even if "the selected delay unit" and "the non-selected delay unit" are changed to each other, the operation can be performed continuously. (Hereinafter, it will be assumed that a difference between the delay values becomes 1*clock.)

The reason why the second control unit 320 makes the sum of the delay values of the first delay unit 330 and the second delay unit 340 become 2*clock in the above-described embodiment is that it is assumed that the delay values of the first delay unit 330 and the second delay unit 340 are in the range of from about 0.5*clock−α to about 1.5*clock+α (α is a margin). Therefore, if the delay values of the first delay unit 330 and the second delay unit 340 are in the range of from about 0.5*clock−α to about 2.5*clock+α, the sum of the delay values of the first delay unit 330 and the second delay unit 340 may become 3*clock. That is, the sum of the delay values of the first delay unit 330 and the second delay unit 340 may become 2*clock or N*clock (N is an integer of 2 or larger) depending on a range of the delay values of the first delay unit 330 and the second delay unit 340. (Hereinafter, it will be assumed that the delay values of the first delay unit 330 and the second delay unit 340 are in the range of from about 0.5*clock−α to about 1.5*clock+α and the second control unit 320 controls the sum of the delay values of the first delay unit 330 and the second delay unit 340 to become 2*clock.)

Figure 4:
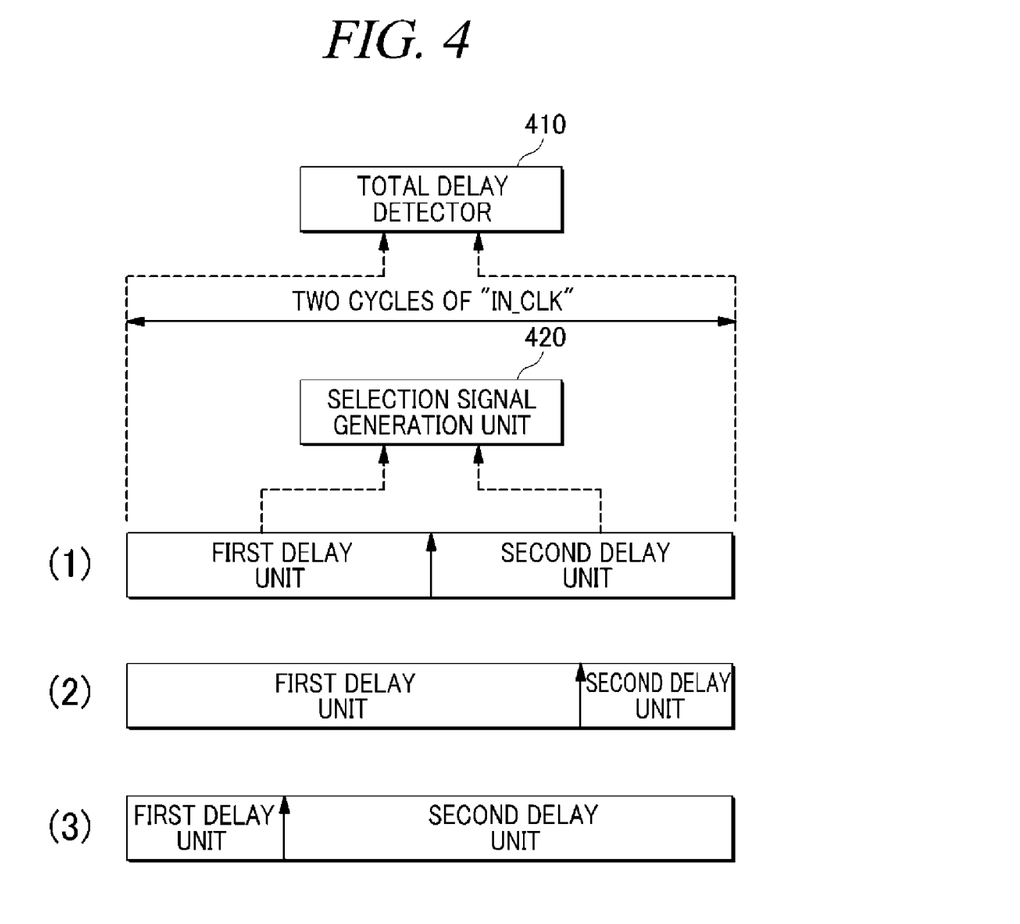
FIG. 4 is provided to explain an operation of the present disclosure.

FIG. 4 is provided to explain an operation of the present disclosure.

A stage (1) of FIG. 4 is the initial state.

A length of a cross bar indicates a delay value of each delay unit. An upward arrow indicating the output signal (OUT_CLK) divides the inside of the cross bar, and a length of the left part of the upward arrow indicates the delay value of the first delay unit 330 and a length of the right part indicates the delay value of the second delay unit 340. The total length of the cross bar is 2*clock which is constantly maintained by a total delay detector 410. The total delay detector 410 maintains the sum of the delay values of the first delay unit 330 and the second delay unit 340 in response to the input signal (IN_CLK) and the signal obtained from the input signal (IN_CLK) passing through the first delay unit 330 and the second delay unit 340.

In the stage (1) of FIG. 4, both the first delay unit 330 and the second delay unit 340 have the delay value of 1*clock. However, each delay unit does not necessarily have the delay value of 1*clock in the initial state. That is, the initial state can be seen at any point between a one-fourth point (where the delay value of the first delay unit 330 is 0.5*clock and the delay value of the second delay unit 340 is 1.5*clock) and three-fourth point (where the delay value of the first delay unit 330 is 1.5*clock and the delay value of the second delay unit 340 is 0.5*clock) of the cross bar. Hereinafter, it will be assumed that the first delay unit 330 is "the selected delay unit."

In a state (2) of FIG. 4, the delay increase signal (UP_IN) is inputted, and the delay value of the first delay unit 330 is increased to 1.5*clock and the delay value of the second delay unit 340 is decreased to 0.5*clock. When the delay value of the first delay unit 330 reaches 1.5*clock, the selection signal generation unit 360 changes a logic value of the selection signal (CH_SIG) to select "the selected delay unit," so that the second delay unit 340 is changed to "the selected delay unit" and the first delay unit 330 is changed to "the non-selected unit."

In a state (3) of FIG. 4, the delay decrease signal (DN_IN) is inputted, and the delay value of the first delay unit 330 is decreased to 0.5*clock and the delay value of the second delay unit 340 is increased to 1.5*clock. When the delay value of the first delay unit 330 reaches 0.5*clock, the selection signal generation unit 360 changes the logic value of the selection signal (CH_SIG) to select "the selected delay unit," so that the second delay unit 340 is changed to "the selected delay unit" and the first delay unit 330 is changed to "the non-selected unit."

Figure 5:
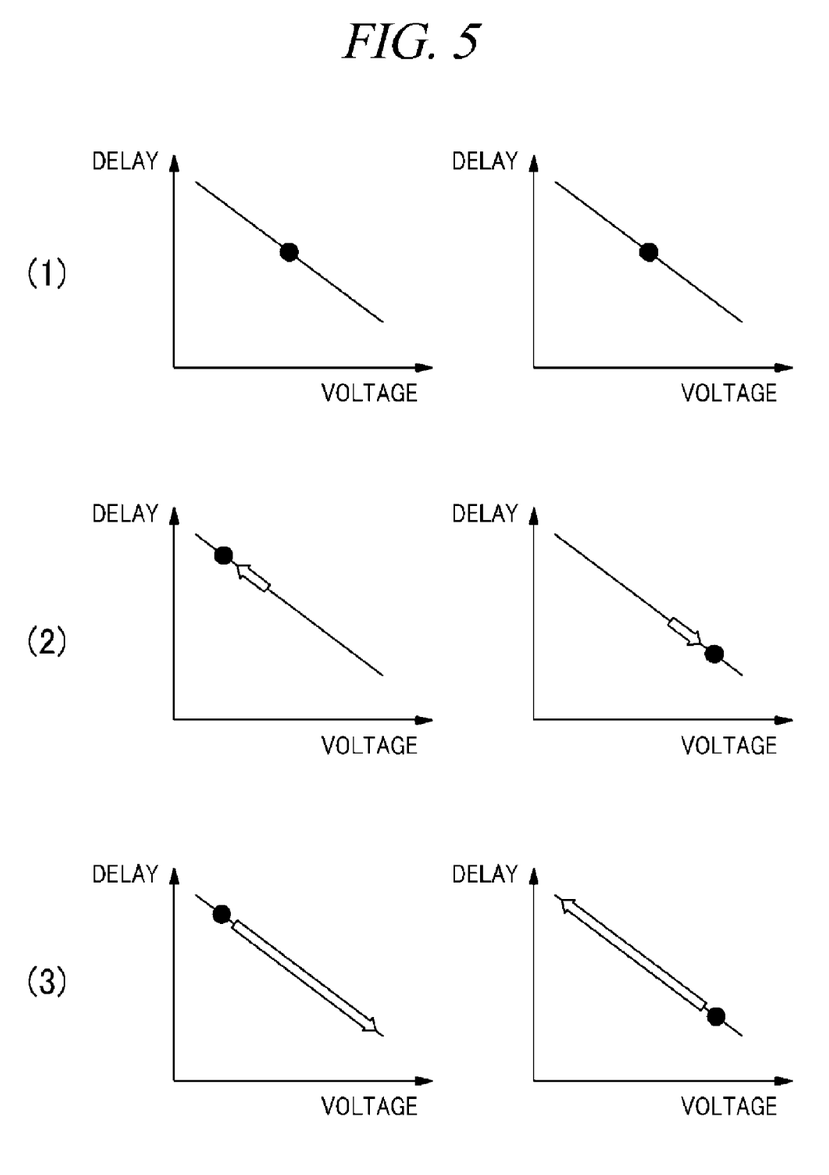
FIG. 5 shows changes in delay values of voltage controlled delay lines within a variable delay circuit in accordance with the present disclosure.

FIG. 5 is a conceptual view for showing changes in delay values of voltage controlled delay lines within a variable delay circuit in accordance with the present disclosure.

In an initial state (1) of FIG. 5, delay values of the first voltage controlled delay line 333 and the second voltage controlled delay line 343 are 1*clock.

In a state (2) of FIG. 5, the delay value of the first voltage controlled delay line 333 is increased and the delay value of the second voltage controlled delay line 343 is decreased. If the first delay unit 330 is "the selected delay unit," the delay increase signal (UP_IN) is inputted and the delay value of the first voltage controlled delay line 333 is increased and the delay value of the second voltage controlled delay line 343 is decreased. When the delay value of the first voltage controlled delay line 333 is 1.5*clock and the delay value of the second voltage controlled delay line 343 is 0.5*clock, the selection signal generation unit 360 changes the logic value of the selection signal (CH_SIG) to select "the selected delay unit", so that the second delay unit 340 is changed to "the selected delay unit" and the first delay unit 330 is changed to "the non-selected unit." If the second delay unit 340 is "the selected delay unit," the delay decrease signal (DN_IN) is inputted and the delay value of the second voltage controlled delay line 343 is decreased and the delay value of the first voltage controlled delay line 333 is increased. When the delay value of the second voltage controlled delay line 343 is 0.5*clock and the delay value of the first voltage controlled delay line 333 is 1.5*clock, the selection signal generation unit 360 changes the logic value of the selection signal (CH_SIG) to select "the selected delay unit", so that the first delay unit 330 is changed to "the selected delay unit" and the second delay unit 340 is changed to "the non-selected unit."

In a state (3) of FIG. 5, the delay value of the first voltage controlled delay line 333 is decreased and the delay value of the second voltage controlled delay line 343 is increased. If the first delay unit 330 is "the selected delay unit," the delay decrease signal (DN_IN) is inputted and the delay value of the first voltage controlled delay line 333 is decreased and the delay value of the second voltage controlled delay line 343 is increased. When the delay value of the first voltage controlled delay line 333 is 0.5*clock and the delay value of the second voltage controlled delay line 343 is 1.5*clock, the selection signal generation unit 360 changes the logic value of the selection signal (CH_SIG) to select "the selected delay unit", so that the second delay unit 340 is changed to "the selected delay unit" and the first delay unit 330 is changed to "the non-selected unit." If the second delay unit 340 is "the selected delay unit," the delay increase signal (UP_IN) is inputted and the delay value of the second voltage controlled delay line 343 is increased and the delay value of the first voltage controlled delay line 333 is decreased. When the delay value of the second voltage controlled delay line 343 is 1.5*clock and the delay value of the first voltage controlled delay line 333 is 0.5*clock, the selection signal generation unit 360 changes the logic value of the selection signal (CH_SIG) to select "the selected delay unit", so that the first delay unit 330 is changed to "the selected delay unit" and the second delay unit 340 is changed to "the non-selected unit."

Figure 6:
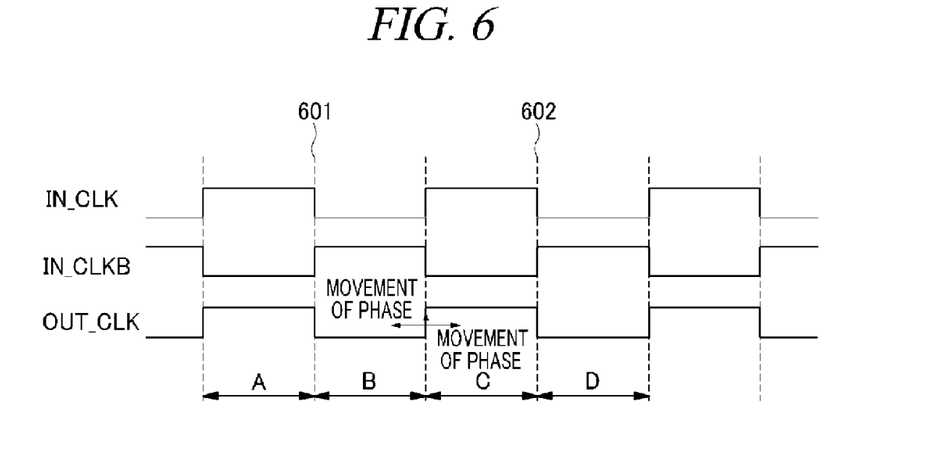
FIG. 6 shows an operation principle of a selection signal generation unit in accordance with the present disclosure.

FIG. 6 shows an operation principle of a selection signal generation unit in accordance with the present disclosure.

The selection signal generation unit 360 compares an input signal B (IN_CLKB) having a reverse phase to the input signal (IN_CLK) with the output signal (OUT_CLK) and changes the logic value of the selection signal (CH_SIG).

When the delay value of the variable delay circuit 210 is decreased, the output signal (OUT_CLK) moves to the left and when the delay value is increased, the output signal (OUT_CLK) moves to the right. There will be explained a movement of an upward arrow marked at the output signal (OUT_CLK), i.e., a rising edge of the output signal (OUT_CLK) (hereinafter, referred to as "rising edge"). In an initial state, the output signal (OUT_CLK) is a signal obtained by delaying the input signal (IN_CLK) by 1*clock. Here, the initial state can be seen in a range of the delay values of the delay unit, which is selected by the selection signal (CH_SIG) and delays the input signal (IN_CLK), from about 0.5*clock to about 1.5*clock. In the initial state of FIG. 6, the delay unit does not necessarily have the delay value of 1*clock. That is, the upward arrow of FIG. 6 may start from any position in a section A or a section B.

If the delay value is decreased, when the output signal (OUT_CLK) moves to the left and the rising edge reaches a first boundary line 601, the delay value reaches a limit of 0.5*clock. Accordingly, the selection signal generation unit 360 changes the logic value of the selection signal (CH_SIG). Further, if the delay value is increased, when the output signal (OUT_CLK) moves to the right and the rising edge reaches a second boundary line 602, the delay value reaches a limit of 1.5*clock. Accordingly, the selection signal generation unit 360 changes the logic value of the selection signal (CH_SIG). If the output signal (OUT_CLK) moves between the section B and a section C, i.e., between the first boundary line 601 and the second boundary line 602, the delay value of "the selected delay unit" does not reach a limit, and, thus, the logic value of the selection signal (CH_SIG) is not changed.

In other words, when the delay value of "the selected delay unit" reaches the limit and cannot be further increased or decreased, the selection signal generation unit 360 changes the logic value of the selection signal (CH_SIG) to be different from the previous logic value.

Figure 7:
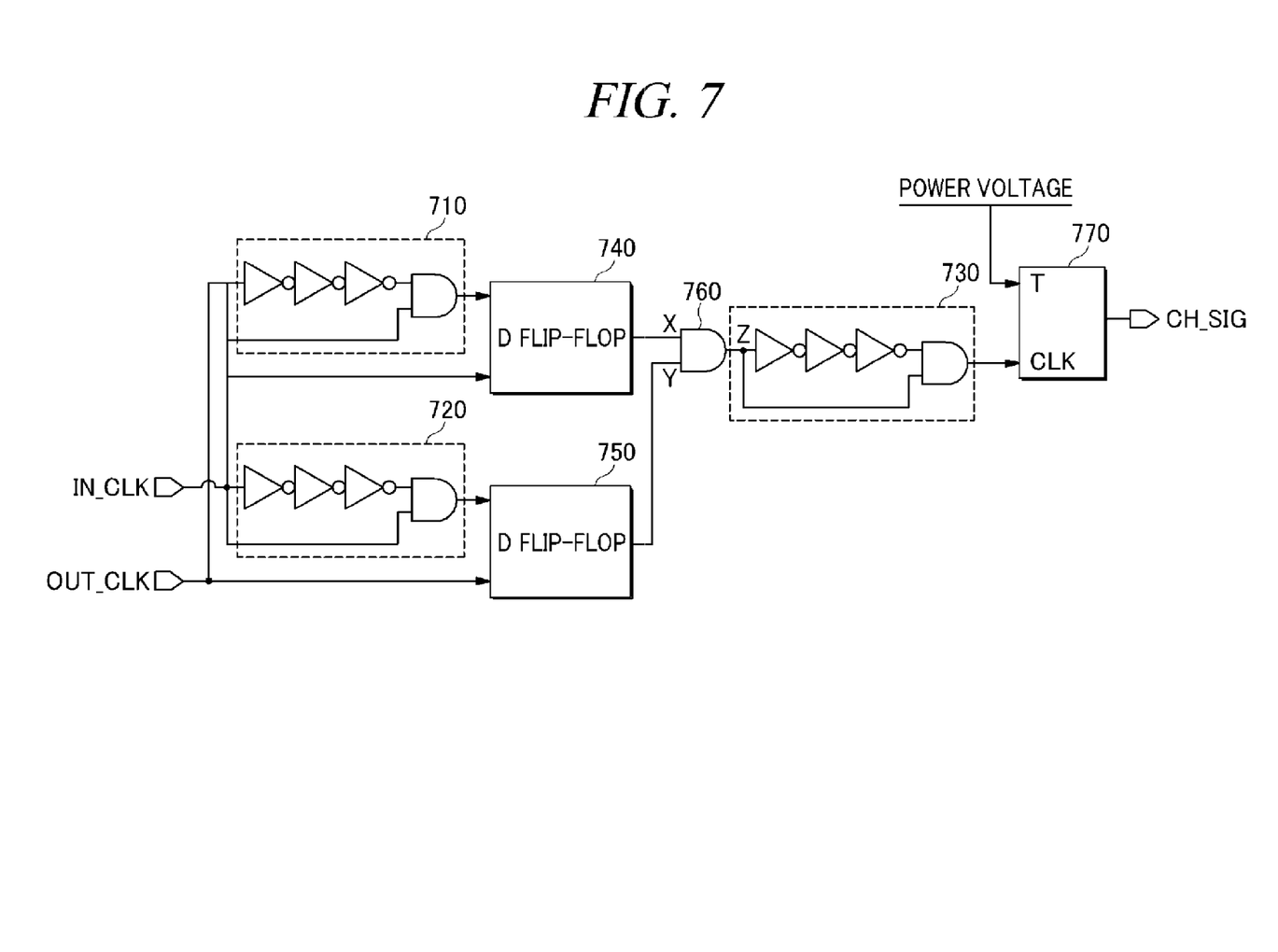
FIG. 7 is a configuration view of a selection signal generation unit in accordance with an embodiment of the present disclosure.

FIG. 7 is a configuration view of a selection signal generation unit in accordance with an embodiment of the present disclosure.

As described above, the delay value of "the selected delay unit" reaches the limit, the selection signal generation unit 360 changes the logic value of the selection signal (CH_SIG) and changes "the selected delay unit" and "the non-selected delay unit" to each other.

A first pulse wave generator 710 generates a pulse signal at a rising edge of the input signal B (IN_CLKB) having the reverse phase to the input signal (IN_CLK), a second pulse wave generator 720 generates a pulse signal at a rising edge of the output signal (OUT_CLK), and a third pulse wave generator 730 generates a pulse signal at a rising edge of an output signal (Z) of an AND gate 760. A first D flip-flop 740 stores an output of the first pulse wave generator 710 at the rising edge of the input signal B (IN_CLKB) and outputs it for about 1*clock and a second D flip-flop 750 stores an output of the second pulse wave generator 720 at the rising edge of the output signal (OUT_CLK) and outputs it for about 1*clock.

Above all, there will be explained a case where the logic value of the selection signal (CH_SIG) of the selection signal generation unit 360 is maintained.

If the delay value of "the selected delay unit" is changed between the section B and the section C of FIG. 6, both input signals (X and Y) of the AND gate become "low" and the output signal (Z) becomes "low." Since the third pulse wave generator 730 does not generate a pulse wave, a clock signal (CLK) of a T flip-flop 770 becomes "low" and the logic value of the selection signal (CH_SIG) is maintained as it was.

There will be explained a case where the output signal (OUT_CLK) of FIG. 6 moves to the left and reaches the first boundary line 601, so that the logic value of the selection signal (CH_SIG) is changed.

When a section where the pulse wave generated by the first pulse wave generator 710 is "high" meets the rising edge of the input signal B (IN_CLKB), a pulse signal having a pulse width of about 1*clock is outputted at the first D flip-flop 740, and when a section where the pulse wave generated by the second pulse wave generator 720 is "high" meets the rising edge of the output signal (OUT_CLK), a pulse signal having a pulse width of about 1*clock is outputted at the second D flip-flop 750. Therefore, if the input signals (X and Y) of the AND gate 760 is "high" for about 1*clock, so that the output signal (Z) of the AND gate 760 becomes "high" for about 1*clock, and the pulse signal is generated by the third pulse wave generator 730 and inputted to the T flip-flop 770, an input signal (T) of the T flip-flop 770 is "high" all the time. Accordingly, the logic value of the selection signal (CH_SIG) as an output of the T flip-flop 770 is changed.

There will be explained a case where the output signal of FIG. 6 moves to the right and reaches the second boundary line 602, so that the logic value of the selection signal (CH_SIG) is changed.

When the section where the pulse wave generated by the first pulse wave generator 710 is "high" meets the rising edge of the input signal B (IN_CLKB), a pulse signal having a pulse width of about 1*clock is outputted at the first D flip-flop 740, and when the section where the pulse wave generated by the second pulse wave generator 720 is "high" meets the rising edge of the output signal (OUT_CLK), a pulse signal having a pulse width of about 1*clock is outputted at the second D flip-flop 750. Therefore, if the input signals (X and Y) of the AND gate 760 is "high" for about 1*clock, so that the output signal (Z) of the AND gate 760 becomes "high" for about 1*clock, and the pulse signal is generated by the third pulse wave generator 730 and inputted to the T flip-flop 770, the input signal (T) of the T flip-flop 770 is "high" all the time. Accordingly, the logic value of the selection signal (CH_SIG) as an output of the T flip-flop 770 is changed.

When a data signal is "low," the T flip-flop maintains a value of the output signal as it was regardless of the clock signal (CLK), and when the data signal is "high," the T flip-flop changes the output signal whenever the clock signal (CLK) becomes "high." That is, if the clock signal (CLK) is "high" when the output signal is "high," the T flip-flop changes the output signal to be "low" and if the clock signal (CLK) is "high" when the output signal is "low," the T flip-flop changes the output signal to be "high."

Figure 8:
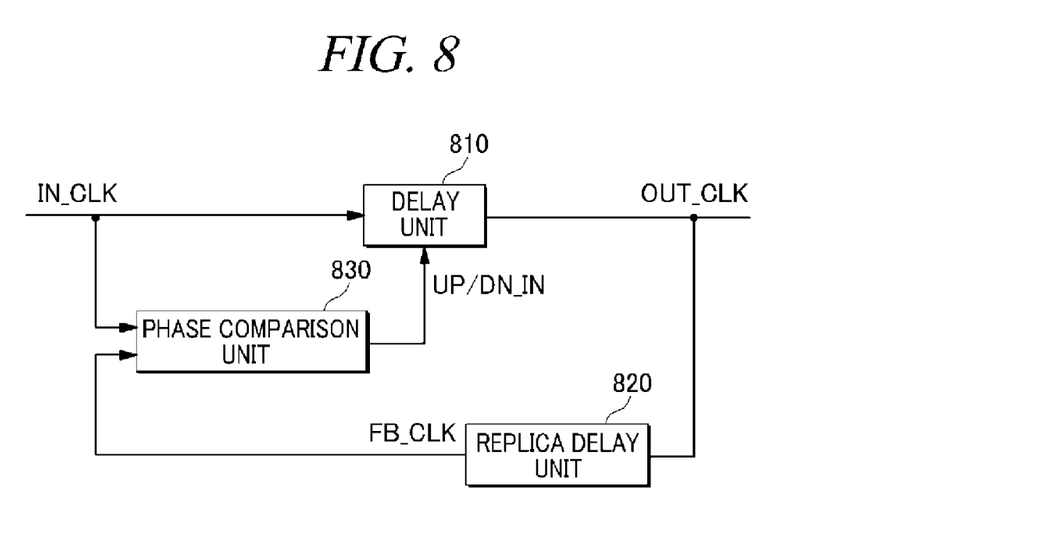
FIG. 8 is a configuration view of a delay-locked loop in accordance with the present disclosure.

FIG. 8 is a configuration view showing variable delay circuit applied to a delay-locked loop in accordance with the present disclosure.

A delay locked-loop includes a delay unit 810 that delays an input clock (IN_CLK) and generates an output clock (OUT_CLK), a replica delay unit 820 that delays the output clock (OUT_CLK) as much as a delay value in a system to which the delay-locked loop is applied and outputs it to a feedback clock (FB_CLK), a phase comparison unit 830 that compares the input clock (IN_CLK) with the feedback clock (FB_CLK) and increase or decrease the delay value of the delay unit to make the input clock (IN_CLK) equal to the feedback clock (FB_CLK). Unlike the configuration view of FIG. 1, FIG. 8 shows a configuration view of the delay-locked loop in which the delay unit 810 is formed of the variable delay circuit 210 of the present disclosure. If the variable delay circuit 210 of the present disclosure is applied to delay-locked loop, an input of the delay-locked loop becomes an input signal (IN_CLK) of the variable delay circuit 210, an output of the delay-locked loop becomes an output signal (OUT_CLK) of the variable delay circuit 210 and an output of the phase comparison unit becomes a delay increase/decrease signal (UP_IN/DN_IN) of the variable delay circuit 210.

The delay value of the variable delay circuit 210 of the present disclosure does not have a limit, and, thus, the delay-locked loop of FIG. 8 does not have a limit of an operation range unlike a conventional delay-locked loop.

The above description of the present invention is provided for the purpose of illustration, and it would be understood by those skilled in the art that various changes and modifications may be made without changing technical conception and essential features of the present invention. Thus, it is clear that the above-described embodiments are illustrative in all aspects and do not limit the present invention.

The scope of the present invention is defined by the following claims rather than by the detailed description of the embodiment. It shall be understood that all modifications and embodiments conceived from the meaning and scope of the claims and their equivalents are included in the scope of the present invention.

What is claimed is:

1. A variable delay circuit comprising:
   a delay circuit that includes a first delay unit and a second delay unit and delays an input signal to generate an output signal;
   a selection signal generation unit that detects a delay value of the delay circuit and generates a selection signal to select a delay unit for delaying the input signal among the first delay unit and the second delay unit;
   a first control unit that controls a delay value of a selected delay unit which is selected by the selection signal in response to a delay increase/decrease signal; and
   a second control unit that controls a delay value of a non-selected delay unit which is not selected by the selection signal,
   wherein the input signal is a clock with a clock frequency, and the second control unit controls the delay value of the non-selected delay unit to be N*clock frequency (N is an integer of 2 or larger)–the delay value of the selected delay unit, and
   wherein the selection signal generation unit generates the selection signal to change the delay unit selected at a time when a difference between the delay values of the first delay unit and the second delay unit becomes M*clock frequency (M is an integer of 1 or larger).

2. The variable delay circuit of claim 1, wherein the first control unit includes a first charge pump that generates a first charging/discharging current in response to the delay increase/decrease signal.

3. The variable delay circuit of claim 2, wherein the second control unit includes:
   a total delay detector that receives the input signal and a signal obtained from the input signal passing through the first delay unit and the second delay unit and generates a control signal for controlling the delay value of the non-selected delay unit; and
   a second charge pump that generates a second charging/discharging current in response to the control signal.

4. The variable delay circuit of claim 3, wherein the first delay unit includes:
   a first selection unit configured to select one of the first charging/discharging current and the second charging/discharging current;
   a first loop filter configured to be charged and discharged in response to an output of the first selection unit; and
   a first voltage controlled delay line configured to delay an input signal to make an output in response to a voltage charged in the first loop filter.

5. The variable delay circuit of claim 4, wherein the second delay unit includes:
   a second selection unit configured to select one of the first charging/discharging current and the second charging/discharging current;
   a second loop filter configured to be charged and discharged in response to an output of the second selection unit; and
   a second voltage controlled delay line configured to delay an input signal to make an output in response to an output voltage of the second loop filter.

6. The variable delay circuit of claim 3, wherein the delay circuit includes:
   a third selection unit configured to input one of an output signal of the second delay unit and the input signal to the first delay unit in response to the selection signal;
   a fourth selection unit configured to input one of an output signal of the first delay unit and the input signal to the second delay unit in response to the selection signal; and
   a fifth selection unit configured to select one of the output signals of the first delay unit and the second delay unit as an output signal of the variable delay circuit in response to the selection signal and transmit the other signal to the second control unit.

7. A delay-locked loop comprising:
   a variable delay unit that delays an external clock to output an internal clock;
   a replica delay unit that delays the internal clock to generate a feedback clock; and
   a phase comparison unit that compares a phase of the feedback clock with a phase of the external clock to generate a delay increase/decrease signal,
   wherein the variable delay unit includes:
      a delay circuit that includes a first delay unit and a second delay unit and delays the external clock to generate the internal clock;
      a selection signal generation unit that detects a delay value of the delay circuit and generates a selection signal to select a delay unit for delaying the external clock among the first delay unit and the second delay unit;
      a first control unit that controls a delay value of the selected delay unit which is selected by the selection signal in response to the delay increase/decrease signal; and
      a second control unit that controls a delay value of a non-selected delay unit which is not selected by the selection signal,
      wherein the external clock is a clock with a clock frequency, and the second control unit controls the delay value of the non-selected delay unit to be N*clock frequency (N is an integer of 2 or larger)–the delay value of the selected delay unit, and wherein the selection signal generation unit generates the selection signal to change the delay unit selected at a time when a difference between the delay values of the first delay unit and the second delay unit becomes M*clock frequency (M is an integer of 1 or larger).

8. The delay-locked loop of claim 7, wherein the first control unit includes:
a first charge pump that generates a first charging/discharging current in response to the delay increase/decrease signal, and
the second control unit includes:
a total delay detector that receives the external clock and a signal obtained from the external clock passing through the first delay unit and the second delay unit and generates a control signal for controlling the delay value of the non-selected delay unit; and
a second charge pump that generates a second charging/discharging current in response to the control signal.

9. The delay-locked loop of claim 8, wherein the first delay unit includes:
a first selection unit configured to select one of the first charging/discharging current and the second charging/discharging current;
a first loop filter configured to be charged and discharged in response to an output of the first selection unit; and
a first voltage controlled delay line configured to delay an input signal to make an output in response to a voltage charged in the first loop filter, and the second delay unit includes:
a second selection unit configured to select one of the first charging/discharging current and the second charging/discharging current;
a second loop filter configured to be charged and discharged in response to an output of the second selection unit; and
a second voltage controlled delay line configured to delay an input signal to make an output in response to an output voltage of the second loop filter.

10. The delay-locked loop of claim 8, wherein the delay circuit includes:
a third selection unit configured to input one of an output signal of the second delay unit and the external clock to the first delay unit in response to the selection signal;
a fourth selection unit configured to input one of an output signal of the first delay unit and the external clock to the second delay unit in response to the selection signal; and
a fifth selection unit configured to select one of the output signals of the first delay unit and the second delay unit as an output signal of the variable delay circuit in response to the selection signal and transmit the other signal to the second control unit.

11. The variable delay circuit of claim 1, wherein the non-selected delay unit delays an output of the selected delay unit.

12. The delay-locked loop of claim 7, wherein the non-selected delay unit delays an output of the selected delay unit.

* * * * *